United States Patent
Edo

(10) Patent No.: US 7,024,266 B2
(45) Date of Patent: Apr. 4, 2006

(54) SUBSTRATE PROCESSING APPARATUS, METHOD OF CONTROLLING SUBSTRATE, AND EXPOSURE APPARATUS

(75) Inventor: Ryo Edo, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 55 days.

(21) Appl. No.: 10/200,782

(22) Filed: Jul. 24, 2002

(65) Prior Publication Data

US 2003/0021671 A1    Jan. 30, 2003

(30) Foreign Application Priority Data

Jul. 27, 2001    (JP) .............................. 2001-227549

(51) Int. Cl.
    *G06F 19/00*    (2006.01)
(52) U.S. Cl. .................................... 700/112
(58) Field of Classification Search ........ 700/112–114, 700/117–121
    See application file for complete search history.

(56) References Cited

U.S. PATENT DOCUMENTS

| | | | |
|---|---|---|---|
| 4,975,168 A * | 12/1990 | Ohno et al. ............ 204/192.13 |
| 5,044,314 A * | 9/1991 | McNeilly .................... 118/715 |
| 5,267,607 A | 12/1993 | Wada ......................... 165/80.1 |
| 5,286,296 A | 2/1994 | Sato et al. .................... 118/719 |
| 5,303,671 A | 4/1994 | Kondo et al. ................ 118/719 |
| 5,314,541 A | 5/1994 | Saito et al. .................. 118/725 |
| 5,436,202 A * | 7/1995 | Miura ......................... 228/102 |
| 5,439,780 A | 8/1995 | Joshi et al. .................. 430/296 |
| 5,489,339 A * | 2/1996 | Hattori et al. .......... 118/723 R |
| 5,524,131 A | 6/1996 | Uzawa et al. .................. 378/34 |
| 5,611,655 A * | 3/1997 | Fukasawa et al. .......... 414/217 |
| 5,618,350 A | 4/1997 | Ishikawa et al. ............ 118/725 |
| 5,761,064 A | 6/1998 | La et al. ................. 364/468.17 |
| 5,822,389 A | 10/1998 | Uzawa et al. .................. 378/34 |

(Continued)

FOREIGN PATENT DOCUMENTS

EP    0 863 439 A2    2/1998

(Continued)

OTHER PUBLICATIONS

European Search Report dated Feb. 10, 2004, issued in corresponding European patent appln. No. 02 25 5150, forwarded in a Communication dated Feb. 17, 2004.

*Primary Examiner*—Maria N. Von Buhr
(74) *Attorney, Agent, or Firm*—Fitzpatrick, Cella, Harper & Scinto

(57) ABSTRACT

A substrate processing apparatus includes a first chamber, a second chamber which has a first valve, a second valve and a chuck, wherein a substrate is transferred to the second chamber through the first valve, held by the chuck in the second chamber, and then transferred to the first chamber through the second valve, a pressure reduction section which reduces a pressure in the second chamber to a predetermined pressure while the substrate is held by the chuck in the second chamber, a thermoregulator which is arranged in the chuck and regulates a temperature of the substrate held by the chuck to be a predetermined temperature, and a controller which controls the pressure reduction section so as to make a relationship between the pressure in the second chamber and a pressure reduction time in the second chamber fall within a predetermined range, controls the chuck so as to make a suction force for the substrate constant, and controls the thermoregulator so as to make a temperature of the chuck constant.

16 Claims, 14 Drawing Sheets

U.S. PATENT DOCUMENTS

| | | | |
|---|---|---|---|
| 5,837,059 A | 11/1998 | Glants | 118/733 |
| 5,906,680 A * | 5/1999 | Meyerson | 117/88 |
| 5,914,493 A | 6/1999 | Morita et al. | 250/492.2 |
| 5,925,227 A | 7/1999 | Kobayashi et al. | 204/298.25 |
| 5,943,230 A | 8/1999 | Rinnen et al. | 364/147 |
| 5,980,591 A | 11/1999 | Akimoto et al. | 29/25.01 |
| 6,086,952 A * | 7/2000 | Lang et al. | 427/255.29 |
| 6,110,232 A | 8/2000 | Chen et al. | 29/25.01 |
| 6,211,081 B1 * | 4/2001 | Mikata | 438/680 |
| 6,224,312 B1 | 5/2001 | Sundar | 414/217 |
| 6,275,744 B1 * | 8/2001 | Yoshida | 700/218 |
| 6,319,322 B1 | 11/2001 | Ueda et al. | 118/666 |
| 6,321,134 B1 | 11/2001 | Henley et al. | 700/121 |
| 6,328,864 B1 | 12/2001 | Ishizawa et al. | 204/298.01 |
| 6,409,932 B1 * | 6/2002 | Wang et al. | 216/55 |
| 6,448,537 B1 | 9/2002 | Nering | 219/390 |
| 6,457,866 B1 | 10/2002 | Scheibl | 384/104 |
| 6,468,384 B1 * | 10/2002 | Singh et al. | 156/345.27 |
| 6,508,062 B1 * | 1/2003 | Flanigan | 62/3.2 |
| 6,605,226 B1 * | 8/2003 | Wang et al. | 216/12 |
| 6,663,333 B1 * | 12/2003 | Kinnard et al. | 414/217 |
| 6,672,864 B1 * | 1/2004 | Wang et al. | 432/5 |
| 6,707,533 B1 * | 3/2004 | Mishima | 355/53 |
| 6,736,927 B1 * | 5/2004 | Wang et al. | 156/345.27 |
| 6,828,235 B1 | 12/2004 | Takano | 438/680 |
| 2002/0011207 A1 | 1/2002 | Uzawa et al. | 118/666 |

FOREIGN PATENT DOCUMENTS

| | | |
|---|---|---|
| JP | 4-277025 | 10/1992 |
| JP | 5-152425 | 6/1993 |
| JP | 7-142408 | 6/1995 |
| JP | 07-142408 A * | 6/1995 |
| JP | 10-50789 | 2/1998 |
| JP | 10-284389 | 10/1998 |
| JP | 2000-58455 | 2/2000 |
| JP | 2001-118904 | 4/2001 |
| JP | 2002-57100 | 2/2002 |
| WO | WO 99/22403 | 5/1999 |
| WO | WO 99/31714 | 6/1999 |

* cited by examiner

FIG. 12

| | |
|---|---|
| URL | http://www.maintain.co.jp/db/input.html |

TROUBLE DB INPUT WINDOW

OCCURRENCE DATE  2000/3/15 ~1404
TYPE OF APPARATUS  * * * * * * * * * ~1401
SUBJECT  OPERATION ERROR (START-UP ERROR) ~1403
DEVICE S/N  465NS4580001 ~1402
DEGREE OF URGENCY  D ~1405

SYMPTOM  LED IS KEPT FLICKERING AFTER POWER-ON ~1406

REMEDY  POWER ON AGAIN (PRESS RED BUTTON IN ACTIVATION) ~1407

PROGRESS  INTERIM HAS BEEN DONE. ~1408

[SEND] [RESET]  1410  1411  1412
LINK TO RESULT LIST DATABASE   SOFTWARE LIBRARY   OPERATION GUIDE

SEMICONDUCTOR DEVICE MANUFACTURING FLOW

WAFER PROCESS

SUBSTRATE PROCESSING APPARATUS, METHOD OF CONTROLLING SUBSTRATE, AND EXPOSURE APPARATUS

FIELD OF THE INVENTION

The present invention relates to a substrate processing apparatus and a substrate control method and, for example, to a substrate processing apparatus and a substrate processing method suitable for a manufacturing process of a device such as a semiconductor device or a liquid crystal display device.

BACKGROUND OF THE INVENTION

Along with an increase in the degree of integration of a semiconductor device, a semiconductor integrated circuit has been further micropatterned.

For example, considering a semiconductor exposure apparatus which transfers a circuit pattern onto a silicon substrate, the wavelength of exposure light used in exposure must be shortened for micropatterning. The wavelength has been shortened from a g-line and an i-line to a KrF laser beam, an ArF laser beam, an $F_2$ laser beam, a soft X-ray radiated from an SR ring, or the like.

The exposure light with a short wavelength, such as the $F_2$ laser beam or soft X-ray is greatly attenuated in air. Thus, the exposure unit of an exposure apparatus is stored in a chamber, wherein an $N_2$ atmosphere or a pressure-reduced He atmosphere providing small attenuation of the exposure light is formed, or a vacuum atmosphere is formed for an electron beam exposure apparatus, and the like. In a substrate processing apparatus, or the like, when process gas is different from the air or when oxidation of a resist on the substrate is to be prevented, an atmosphere different from the air or the vacuum atmosphere is formed in a chamber.

Conventionally, as such a processing apparatus, an arrangement shown in FIGS. 7 and 8 is known. The substrate processing apparatus of this type includes a process chamber 1 serving as the first chamber which stores a process station for, e.g., exposing the substrate in an atmosphere different from the air, and a substrate supply portion 10 arranged in the air.

The substrate supply portion 10 includes a substrate carrier support portion 101, on which a carrier 102 storing the substrate is placed manually or by an automatic transfer apparatus.

In order to transfer a substrate to be processed between the process chamber 1 and the substrate supply portion 10, a load-lock chamber 3 serving as a second process chamber is arranged. A plurality of load-lock chambers 3 may be arranged for loading/unloading.

In the apparatus shown in FIGS. 7 and 8, the pressure-reduced He atmosphere is formed in the process chamber 1, which stores the processing unit.

The load-lock chamber 3 has a first gate valve 4 on the air side to shield the load-lock chamber 3 from the substrate supply portion 10 in the air, and a second gate valve 5 on the process chamber 1 side to shield the load-lock chamber 3 from the process chamber 1. The load-lock chamber 3 also has an exhaust mechanism 12 for exhausting gas from the load-lock chamber 3, an He gas supply portion 13 for supplying He gas into the load-lock chamber 3, and an $N_2$ gas supply portion 14 for supplying $N_2$ gas into the load-lock chamber 3.

The load-lock chamber 3 includes a substrate holding chuck 6 designed to store, e.g., one or a plurality of substrates.

In the air, a first transfer mechanism 7 for transferring the substrate between the substrate carrier 102 on the carrier support portion 101 and the load-lock chamber 3 is arranged. In a preliminary chamber 2, connected between the process chamber 1 and the load-lock chamber 3, a second transfer mechanism 8 for transferring the substrate between the load-lock chamber 3 and a process station (exposure process portion) 20 is arranged.

The operation of the above conventional apparatus will be described below.

The first transfer mechanism 7 extracts one substrate from the substrate carrier 102 placed on the carrier support portion 101, and transfers the substrate to the load-lock chamber 3.

When the substrate is loaded into the load-lock chamber 3 and placed on the substrate holding chuck 6, the first gate valve is closed to shield the load-lock chamber 3 from the air. The atmosphere in the load-lock chamber 3 is purged.

Purging the atmosphere in the load-lock chamber 3 is performed to be described below.

A vacuum exhaust valve 122 is opened in a state wherein the load-lock chamber 3 is shielded from the air and the chamber 1 by closing the first and second gate valves 4 and 5. The gas is then exhausted from the load-lock chamber 3 by a vacuum exhaust pump (not shown) via a vacuum exhaust pipe 121.

The chamber 3 is evacuated to a predetermined vacuum degree. After evacuating the chamber 3 to the predetermined vacuum degree, the vacuum exhaust valve 122 is closed, and the evacuation is stopped.

The gas supply valve is then opened. The load-lock chamber 3 shown in FIG. 8 includes an He gas supply valve 132 and an $N_2$ gas supply valve 142. At this stage, the He gas supply valve 132 of these supply valves is opened to supply the same gas as the atmosphere in the chamber 1 storing the process station (exposure process portion) 20.

Until the pressure in the load-lock chamber 3 equals that in the process chamber 1, the He gas is supplied. When the pressure in the load-lock chamber 3 equals that in the process chamber 1, the He gas supply valve 132 is closed to stop supplying the He gas.

When supply of the He gas is stopped, the second gate valve 5 is opened. The substrate on the substrate holding chuck 6 is extracted by the second transfer mechanism 8 in the preliminary chamber 2, and transferred to the process station (exposure process portion) 20 in the process chamber 1.

The substrate processed in the process station (exposure process portion) 20 is returned to the substrate carrier 102 via the load-lock chamber 3 by the first and second transfer mechanisms 7 and 8.

During evacuation of the load-lock chamber 3 in the above-apparatus, adiabatic expansion occurs in the load-lock chamber 3, and the gas in the load-lock chamber 3 is cooled.

At this time, since the substrate and the substrate holding chuck 6 in the load-lock chamber 3 are exposed to the gas in the load-lock chamber 3, their temperatures are reduced along with cooling the gas. The substrate cooling by the adiabatic expansion in the load-lock chamber 3 is loaded into the process chamber 1 and processed at the end of purging the atmosphere.

In the exposure apparatus, the substrate temperature needs to be controlled with high precision in order to obtain high transfer precision, the high line-width precision, and the like. However, in the conventional apparatus, the temperature of the substrate loaded into the process chamber 1 via the load-lock chamber 3 is reduced, as described above. Hence, the transfer precision deteriorates when exposure is performed for the wafer in this state, thus posing a problem.

As a prior art arrangement related to the problem as described above, an example is available, in which, in order to control the substrate to a predetermined temperature, the substrate is brought into contact with ambient gas and a substrate transfer means to gradually increase the substrate temperature to the predetermined temperature.

Such a method requires a long period of time for the substrate to reach the predetermined temperature. This makes it difficult to improve the throughput. Specifically, in the apparatus in which the chamber is evacuated, since heat exchange is not performed with the ambient gas, thermoregulation by the ambient gas is not expected.

Hence, in this case, the substrate is thermally regulated only by contact with the substrate transfer means. This requires a longer period of time for the substrate to reach the predetermined temperature.

SUMMARY OF THE INVENTION

The present invention has been made in consideration of the above problem, and has as its object to provide a substrate processing apparatus which prevents a decrease in throughput due to a decrease in temperature of a substrate along with a reduction in pressure in a load-lock chamber, a substrate controlling method, and an exposure apparatus.

The first aspect of the present invention is related to a substrate processing apparatus. The substrate processing apparatus comprises a first chamber, a second chamber, which has a first valve and a second valve, and communicates with the first chamber through said second valve, a thermoregulator which regulates a temperature of the substrate arranged in the second chamber, and a controller which controls a time for which the thermoregulator regulates the temperature of the substrate. In this apparatus, a substrate transferred to the second chamber through the first valve is temporarily held in the second chamber, and then transferred to the first chamber through the second valve.

According to a preferred embodiment of the present invention, the thermoregulator heats the substrate.

According to another preferred embodiment of the present invention, the apparatus further comprises a pressure reduction section which reduces a pressure in the second chamber, and the pressure reduction section makes a relationship between the pressure in the second chamber and a pressure reduction time for which the pressure in the second chamber is reduced fall within a predetermined range.

According to still another preferred embodiment of the present invention, the apparatus further comprises a gas supply portion which supplies a predetermined gas into the second chamber.

According to still another preferred embodiment of the present invention, the thermoregulator is arranged in a chuck for holding the substrate, the chuck including an electrostatic chuck.

According to still another preferred embodiment of the present invention, the thermoregulator is arranged in a chuck for holding the substrate, the chuck being controlled to have substantially a constant power to chuck the substrate.

According to still another preferred embodiment of the present invention, the thermoregulator is arranged in a chuck, and the apparatus further comprises a driving section which separates the substrate from the chuck.

According to still another preferred embodiment of the present invention, the controller controls the driving section so as to make a time for which the substrate is held by the chuck constant.

According to still another preferred embodiment of the present invention, the thermoregulator regulates a temperature of the chuck to be higher than a temperature at which the substrate is to be processed in the first chamber.

According to still another preferred embodiment of the present invention, the apparatus further comprises a transfer section which transfers the substrate, the thermoregulator is arranged in a chuck, and the controller controls the transfer section so as to make a time for which the substrate is held by the chuck constant.

The second aspect of the present invention is related to a substrate processing method. The method includes the steps of regulating a temperature of a substrate in a load-lock chamber, controlling a time for which the temperature of the substrate is regulated in the load-lock chamber, transferring the substrate from the load-lock chamber to a process chamber, and processing the substrate in the process chamber.

The third aspect of the present invention is related to a device manufacturing method. The method comprises the steps of installing, in a device manufacturing factory, manufacturing apparatuses for performing various processes, including the substrate processing apparatus according to the present invention, and manufacturing a device by performing a plurality of processes using the manufacturing apparatuses.

According to a preferred embodiment of the present invention, the method further comprises the steps of connecting the manufacturing apparatuses via a local area network, and communicating information about at least one of the manufacturing apparatuses between the local area network and an external network outside the device manufacturing factory.

According to another preferred embodiment of the present invention, the method further comprises the step of accessing a database provided by a vendor or user of the substrate processing apparatus via the external network, thereby obtaining maintenance information of the exposure apparatus by data communication.

According to still another preferred embodiment of the present invention, the method further comprises the step of performing data communication between the device manufacturing factory and another device manufacturing factory via the external network, thereby performing production management.

The fourth aspect of the present invention is related to a device manufacturing factory. The device manufacturing factory comprises manufacturing apparatuses for performing various processes, including the substrate processing apparatus according to the present invention, a local area network for connecting the manufacturing apparatuses, and a gateway for allowing access to the local area network and an external network outside the device manufacturing factory, wherein information about at least one of the manufacturing apparatuses can be communicated between the local area network and the external network.

The fifth aspect of the present invention is related to a maintenance method of the substrate processing apparatus according to the present invention and installed in the device manufacturing factory. The method comprises the steps of making a vendor or user of the substrate processing apparatus provide a maintenance database connected to an external network outside the device manufacturing factory, allowing access to the maintenance database from the device manufacturing factory via the external network, and transmitting maintenance information accumulated in the maintenance database to the device manufacturing factory via the external network.

According to a preferred embodiment of the present invention, the above substrate processing apparatus preferably further comprises a display, a network interface, and a computer for executing network software, and maintenance information of the substrate processing apparatus can be communicated via a computer network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 12 is a view of a practical example of a user interface;

DETAILED DESCRIPTION OF THE PREFERRED EMBODIMENTS

Embodiment of a Substrate Processing Apparatus

Figure 1:
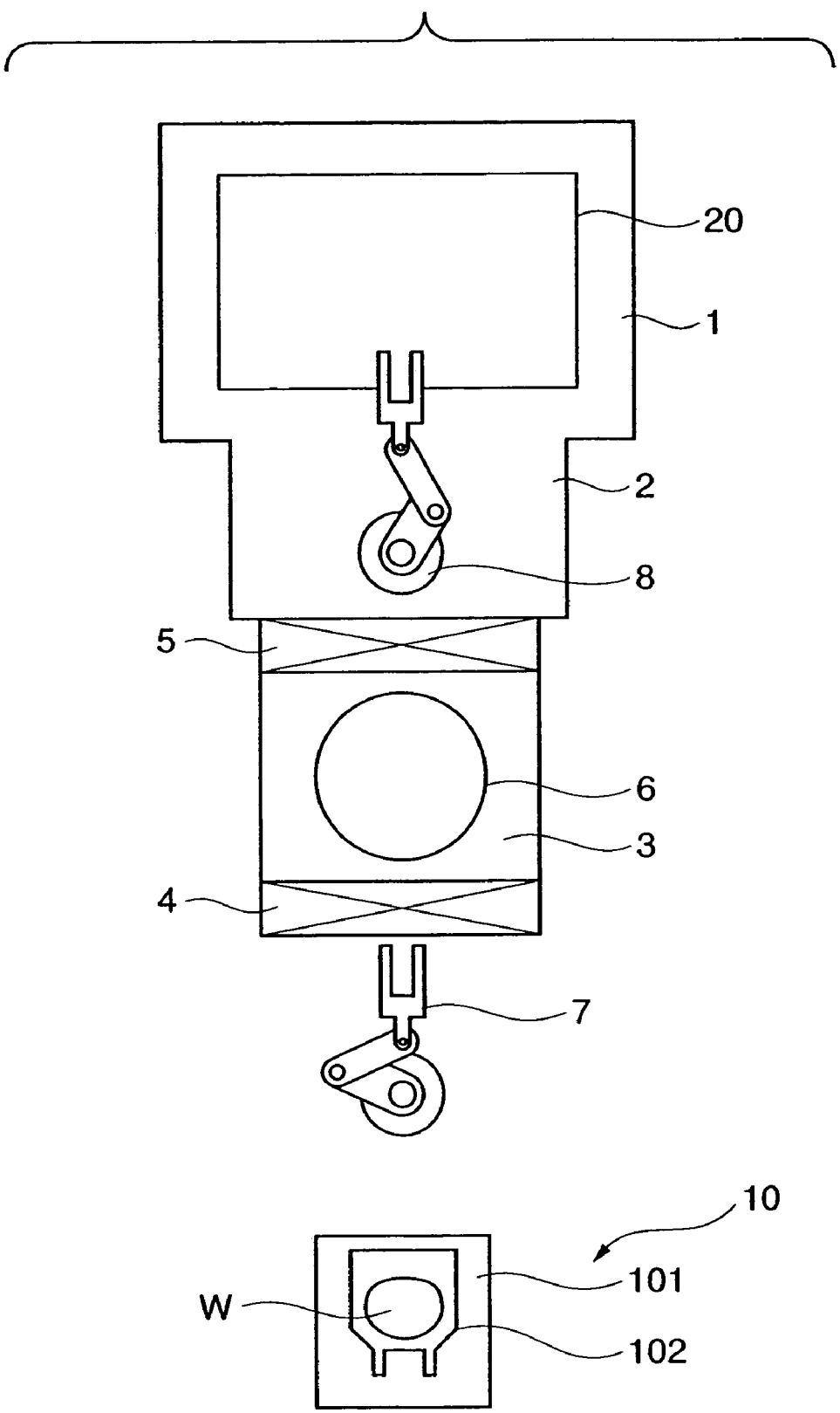
FIG. 1 is a plan view showing the arrangement of a substrate processing apparatus according to a preferred embodiment of the present invention.
Figure 2:
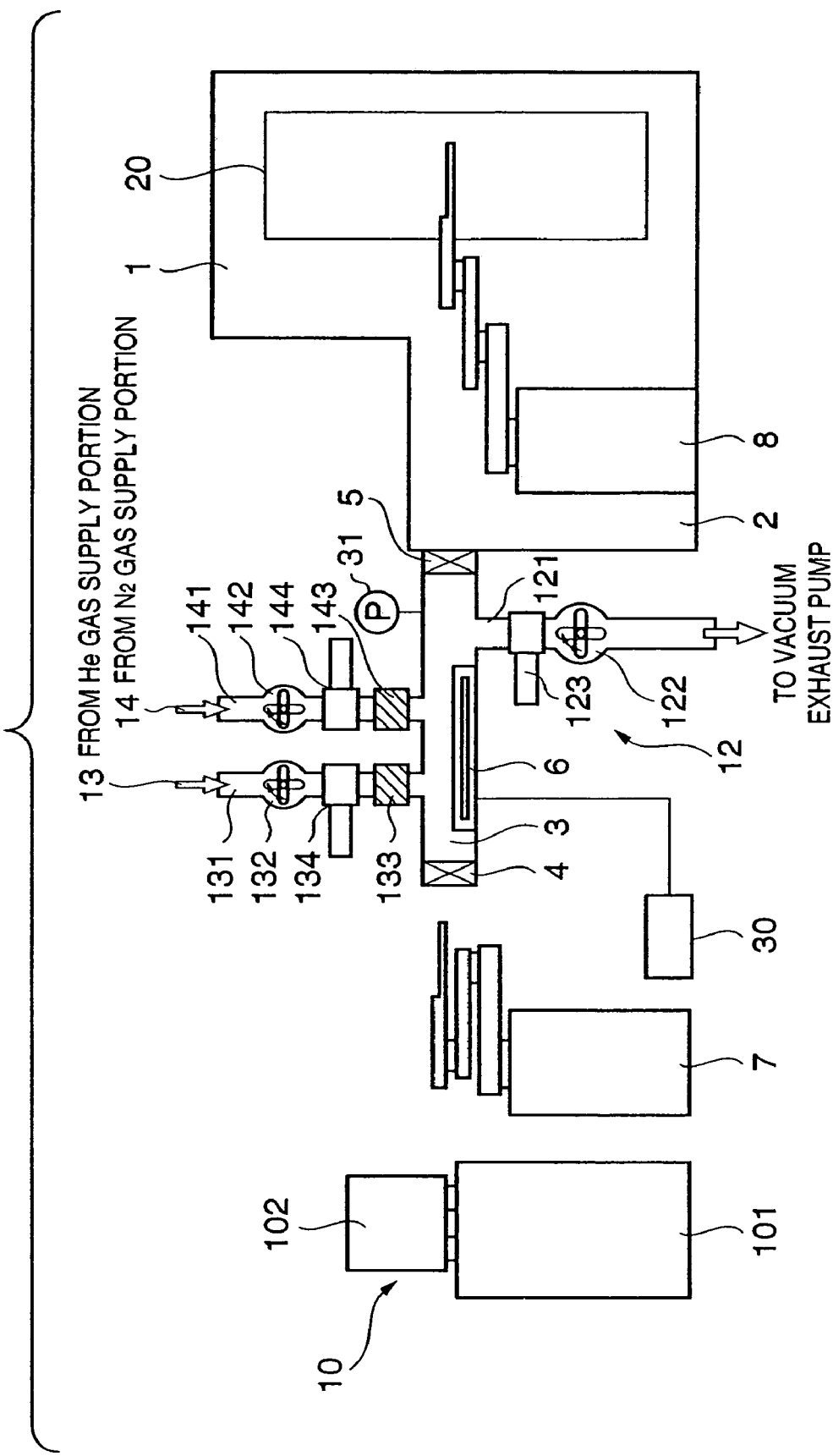
FIG. 2 is an elevational view showing the arrangement of the substrate processing apparatus according to the preferred embodiment of the present invention.

FIG. 1 is a plan view showing an arrangement of a substrate processing apparatus according to a preferred embodiment of the present invention, and FIG. 2 is an elevational view of the apparatus.

The substrate processing apparatus according to this embodiment comprises a process chamber 1 serving as the first process chamber and a substrate supply portion 10 arranged in the air. The process chamber 1 is arranged as an exposure apparatus having an internal space in which an exposure process portion 20 for transferring a pattern to a substrate is arranged and a pressure-reduced He atmosphere is maintained.

The substrate supply portion 10 has a substrate carrier support portion 101, on which a substrate carrier 102 storing a substrate (wafer) W is placed manually or by an automatic transfer apparatus. A preliminary chamber 2, which contains a second transfer mechanism 8, is connected to the process chamber 1.

In order to transfer the substrate (wafer) W serving as a photosensitive substrate, a load-lock chamber 3 serving as the second chamber is arranged between the process chamber 1 and the substrate supply portion 10. The load-lock chamber 3 includes a first gate valve 4 on the air side to shield the load-lock chamber 3 from the substrate supply portion 10 in the air (external environment), and a second gate valve 5 on the chamber side to shield the load-lock chamber 3 from the preliminary chamber 2.

The load-lock chamber 3 also includes a manometer 31 for measuring a pressure in the load-lock chamber 3, an exhaust mechanism 12 for exhausting gas from the load-lock chamber 3, and gas supply portions for supplying gas to the load-lock chamber 3. In this embodiment, an He gas supply portion 13 for supplying He gas and an $N_2$ gas supply portion 14 for supplying $N_2$ gas are arranged as one example of the gas supply portions.

The exhaust mechanism 12 has a vacuum exhaust pump (not shown), a vacuum supply pipe 121 for connecting the vacuum exhaust pump and the load-lock chamber 3, and a vacuum exhaust valve 122 for regulating the flow rate of gas flowing to the vacuum exhaust pump through an exhaust port. The exhaust mechanism 12 also has a flowmeter 123 for measuring the flow rate of gas flowing in the vacuum exhaust tube 121.

The gas supply portions (He gas supply portion 13 and $N_2$ gas supply portion 14) have the same structure. For example, the He gas supply portion 13 has a supply pipe 131 for connecting the He gas supply portion 13 to the load-lock chamber 3, a gas supply valve 13 for controlling supply of gas flowing in the supply pipe 131, and a gas supply flowmeter 134 for measuring the flow rate of gas flowing between the gas supply valve 132 and load-lock chamber 3. Similarly, the $N_2$ gas supply portion 14 has a supply pipe 141 for connecting the $N_2$ gas supply portion 14 to the load-lock chamber 3, a gas supply valve 142 for controlling supply of gas flowing in the supply pipe 141, and a gas supply flowmeter 144 for measuring the flow rate of gas flowing between the gas supply valve 142 and load-lock chamber 3.

Particles are removed by a filter 133 from the supply gas supplied from the He gas supply portion 13 through the gas supply valve 132 and gas supply flowmeter 134, and the cleaned gas is supplied to the process chamber 1 through the load-lock chamber 3. Similarly, particles are removed by a filter 143 from the supply gas supplied from the N₂ gas supply portion 14 through the gas supply valve 142 and gas supply flowmeter 144, and the cleaned gas is supplied to the process chamber 1 through the load-lock chamber 3.

The load-lock chamber 3 has a substrate holding chuck 6 designed, e.g., to store one or a plurality of substrates.

In this embodiment, the substrate holding a chuck 6 is an electrostatic suction chuck with attracts a substrate by applying a voltage from a power surface (not shown). The substrate holding chuck 6 has a voltmeter (not shown) which indicates an applied voltage.

Figure 3A:
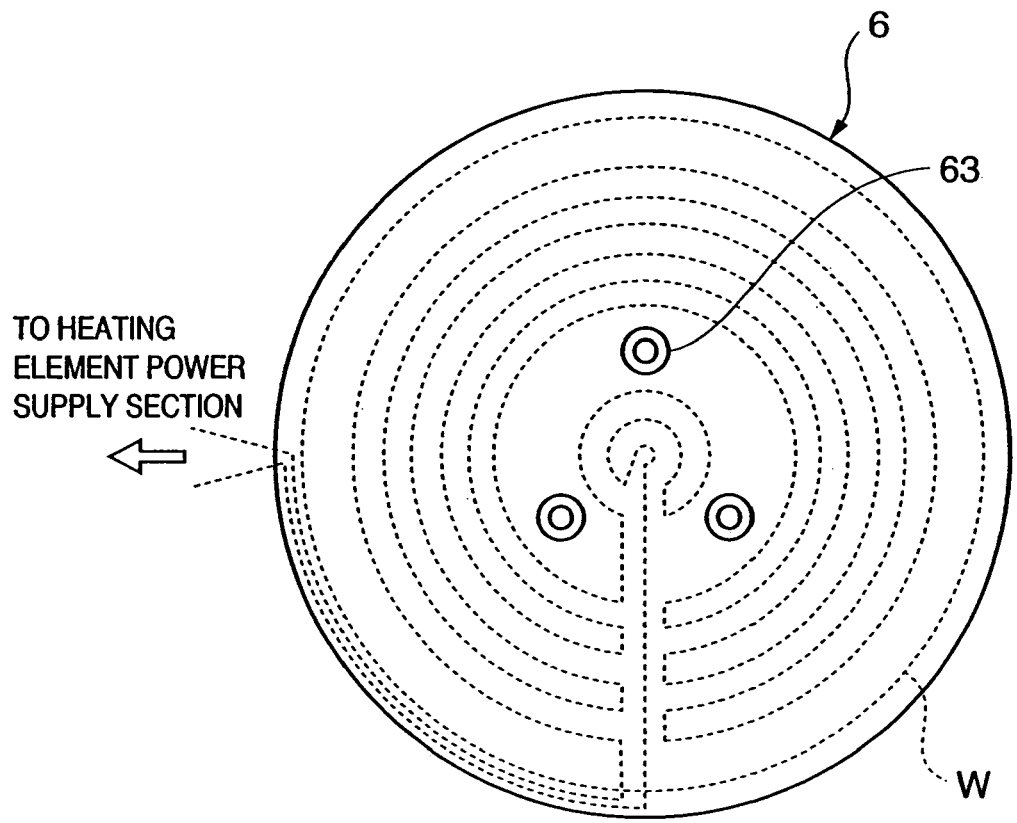
FIGS. 3A and 3B are views for explaining an example of a thermoregulator for a substrate according to the preferred embodiment of the present invention.
Figure 3B:
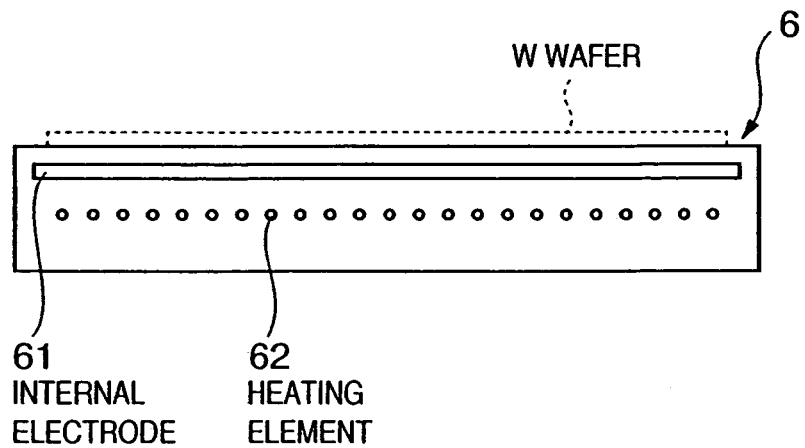

FIGS. 3A and 3B are views showing the substrate holding chuck 6 in this embodiment.

The substrate holding chuck 6 has an internal electrode 61 and a heating element 62 which forms a thermoregulator. As the heating element 62, for example, a heater may be used.

The substrate holding chuck 6 has a temperature sensor (not shown) which measures temperatures of the substrate holding chuck 6 and provides measurement results to the controller of the heating element 62.

The substrate holding chuck 6 further has a driving section which lifts the substrate (wafer) W. The driving section may be formed by, e.g., three pins 63 shown in FIG. 3A, but the present invention is not limited to this. The driving section may have an arbitrary structure as far as it can lift the substrate (wafer) W.

Preferably, the load-lock chamber 3, the first transfer mechanism 7 for transferring a substrate, and the second transfer mechanism 8 are arranged to transfer the substrates one by one. In addition, in order to minimize an exhaustion time, the internal volume of the load-lock chamber 3 is preferably set to a minimum size.

A first transfer mechanism 7 for transferring the substrate (wafer) W between the substrate carrier 102 on the substrate carrier support portion 101 and the load-lock chamber 3 is arranged in the air. The second transfer mechanism 8 for transferring the substrate (wafer) W between the load-lock chamber 3 and process station (exposure apparatus portion) 20 is arranged in the preliminary chamber 2 connected between the process chamber 1 and the load-lock chamber 3.

When the wafer W is to be transferred between the substrate holding chuck 6 and the first and second transfer mechanisms 7 and 8, the three pins 63 lift the wafer W.

The substrate holding hand of the first or second transfer mechanism 7 or 8 is inserted in a gap between the substrate holding chuck 6 and the wafer W lifted by the three pins 63. The substrate holding hand lifts the substrate (wafer) W to separate it from the three pins 63 of the chuck 6. The first or second transfer mechanism 7 or 8 transfers the substrate (wafer) W separated from the three pins 63 of the chuck 6. Note that the first and second transfer mechanisms 7 and 8 transfer the substrate (wafer) W in a horizontal direction in this embodiment, but the present invention is not limited to this. For example, the first and second transfer mechanism 7 and 8 may transfer the substrate (wafer) W in an arbitrary direction, e.g., a vertical direction.

The operation of the substrate (wafer) transfer in the exposure apparatus according to the present invention will be described next.

The arm of the first transfer mechanism 7 is inserted in the substrate carrier 102 in the air, and a single substrate (wafer) W is extracted by this arm. The first transfer mechanism 7 holds the substrate (wafer) W while bending its arm. Meanwhile, the pressure gauge 31 measures the state of the atmosphere in the load-lock chamber 3.

Assume that the pressure of the load-lock chamber 3 measured by the pressure gauge 31 at that time is the atmospheric pressure. In this case, the first transfer mechanism 7 rotates its arm toward the load-lock chamber 3, and after confirming the opening state of the first gate valve 4, the first transfer mechanism 7 stretches its arm toward the substrate (wafer) W to load it into the load-lock chamber 3. The substrate (wafer) W is placed on the three pins 63 of the substrate holding chuck 6.

After the first transfer mechanism 7 moves its arm backward to separate it from the substrate (wafer) W, the three pins 63 of the substrate holding chuck 6 move downward to attract and hold the substrate (wafer) W by the substrate holding chuck 6.

The thermoregulator starts thermal regulation of the wafer W from a timing when the wafer W is attracted and held by the substrate holding chuck 6. A controller 30 manages the time from a timing when the thermoregulator starts the thermal regulation to the wafer W.

After the substrate (wafer) W is attracted and held by the substrate holding chuck 6, the first gate valve 4 is closed, and the air is purged with He. A time from when the substrate (wafer) W is held by the substrate holding chuck 6 until the first evacuation for atmosphere purging is started is a predetermined time.

To purge the atmosphere, the air is exhausted to a vacuum first. Preferably, the vacuum exhaust pump (not shown) is always operated. This always keeps in a vacuum region from the vacuum exhaust pump to the vacuum exhaust valve 122. When the first gate valve 4 is closed and the vacuum exhaust valve is opened, evacuation is started.

In this embodiment, preferably, in, e.g., device assembly, device maintenance, or a test process, an experiment is conducted in advance to obtain a curve representing the relationship between a pressure in the load-lock chamber 3 and a pressure reduction time (vacuum suction time) for which a pressure in the load-lock chamber 3 is reduced by the vacuum exhaust pump (not shown), and the experiment resultant is prepared as data.

In evacuating the load-lock chamber 3, the relationship between a vacuum suction time and a pressure in the load-lock chamber 3 has been monitored by the exhaust gas flowmeter 123 and the pressure gauge 31 of the load-lock chamber 3. When the relationship falls outside a predetermined range with respect to the curve, the opening degree of the exhaust valve 122 is controlled such that the relationship falls within the predetermined range. The predetermined range is set to be narrower than an allowable value in the curve representing the relationship between a pressure and a vacuum suction time decided from the adiabatic cooling of the substrate (wafer) W. The relationship between a vacuum suction time and pressure is controlled such that it does not exceed the allowable value of the curve representing the relationship between the predetermined vacuum suction time and pressure.

Alternatively, the relationship between a pressure in the load-lock chamber 3 and a vacuum suction time can also be monitored by using the pressure gauge 31 of the load-lock chamber 3 and the elapse of time.

That is, even if the pressure of the load-lock chamber 3 is not controlled by the vacuum exhaust valve 122, a vacuum suction time and pressure are measured to obtain a curve representing the relationship therebetween, and it is confirmed to fall (the curve representing the relationship therebetween) within a predetermined range, thereby omitting the control of the vacuum exhaust valve 122.

After evacuating the load-lock chamber 3 to reach the measurement value of a pressure therein measured by the pressure gauge 31 of the load-lock chamber 3 to a predetermined value, the vacuum exhaust valve 122 is closed, and the operation of drawing to a vacuum in the load-lock chamber 3 ends. When the pressure value in the load-lock chamber 3 becomes the predetermined pressure value, the evacuation ends. Consequently, a time from the start to the end of the evacuation is constant every time.

With this operation, the relationship between a vacuum suction time and pressure is made constant every time.

In the evacuation operation described above, gas in the load-lock chamber 3 is cooled by adiabatic expansion, and the substrate (wafer) W in contact with the cooled gas is similarly cooled.

Since the apparatus and a clean room in which the apparatus is installed are in a constant temperature environment, the temperatures of the device and the plurality of substrates (wafers) W before the evacuation operation are constant.

Since a final pressure and vacuum suction time after the evacuation operation are respectively constant, a decrease in temperature due to the adiabatic expansion of gas to be exhausted is made constant.

The relationship between (i) a time in which the cooled gas is in contact with the substrate (wafer) W and (ii) the temperatures of the gas in that time, becomes constant, because the relationship between the vacuum suction time and the pressure is made constant.

Therefore, even when the substrate (wafer) W is cooled by the adiabatic expansion of gas, the temperature of the cooled substrate (wafer) W is uniformly controlled.

The gas supply valve is then opened. The load-lock chamber 3 in FIG. 2 has the He gas supply valve 132 and $N_2$ gas supply valve 142 serving as the gas supply valves. A gas supply valve which is opened in this case is a gas supply valve for supplying the same gas as the atmosphere in the process chamber 1, which is the He gas supply valve 132.

The He gas supply portion 13 supplies He gas until a pressure in the load-lock chamber 3 equals that in the process chamber 1. When a pressure in the load-lock chamber 3 equals that in the process chamber 1, the He gas supply valve 132 is closed, and supply of the He gas is stopped.

The flow rate of the supply gas supplied from the He gas supply portion 13 is measured by the gas supply flowmeter 134. The gas supply flowmeter 134 is so controlled as to end a supply of gas within a predetermined time.

The predetermined time is preferably decided in advance on the basis of the relationship between a flow rate and the volume of the load-lock chamber 3. The gas supply valves 132 and 142 may be controlled on the basis of the measurement values of the gas supply flowmeters 134 and 144 so as to end a supply of gas within a predetermined time.

After stopping supply of the He gas, the second gate valve 5 is opened, and the second transfer mechanism 8 of the preliminary chamber 2 extracts the substrate (wafer) W in the load-lock chamber 3 to transfer it to the process station (exposure process portion) 20.

At this time, the controller 30 controls a thermal regulating time by the substrate holding chuck 6 so as to make constant a time for which the substrate (wafer) W is held on a holding portion (substrate holding chuck 6).

More specifically, in this embodiment, after the substrate (wafer) W is held by the substrate holding chuck 6 for a predetermined time, the controller 30 controls the three pins 63 of the chuck to lift the substrate (wafer) W.

At the stage in which the three pins 63 lift the substrate (wafer) W, the chuck 6 ends the thermal regulation to the substrate (wafer) W. The second transfer mechanism 8 then receives the substrate (wafer) W.

The chuck 6 is preferably an electrostatic chuck. This makes a suction force for the substrate (wafer) W constant regardless of the ambient pressure if an applied voltage to an internal electrode is set to be constant.

In this case, an applied voltage to the internal electrode is measured by a voltmeter (not shown) and kept constant.

By keeping the suction force constant, the contact thermal resistance between the substrate holding chuck 6 and substrate (wafer) W is made constant.

The chuck 6 is similarly cooled by the adiabatic expansion of gas in the load-lock chamber 3, but the thermoregulator (heater) can keep the temperatures of the substrate (wafer) W and substrate holding chuck 6 constant on the basis of a measurement result from the temperature sensor (not shown) formed in the chuck 6.

With this operation, heat given from the chuck 6 to the substrate (wafer) W is made constant.

If the temperature of the chuck 6 is kept at an appropriate temperature in advance, even when the substrate (wafer) W is cooled, a decrease in temperature of the substrate (wafer) W can be recovered by heating the chuck 6 to a temperature higher than the decrease in temperature. The temperature of the substrate (wafer) W is thus kept constant at high precision.

A temperature t1 of the chuck 6 is set at, e.g., the same temperature as a predetermined temperature at which the substrate (wafer) W is to be processed in the process chamber 1.

Figure 6A:
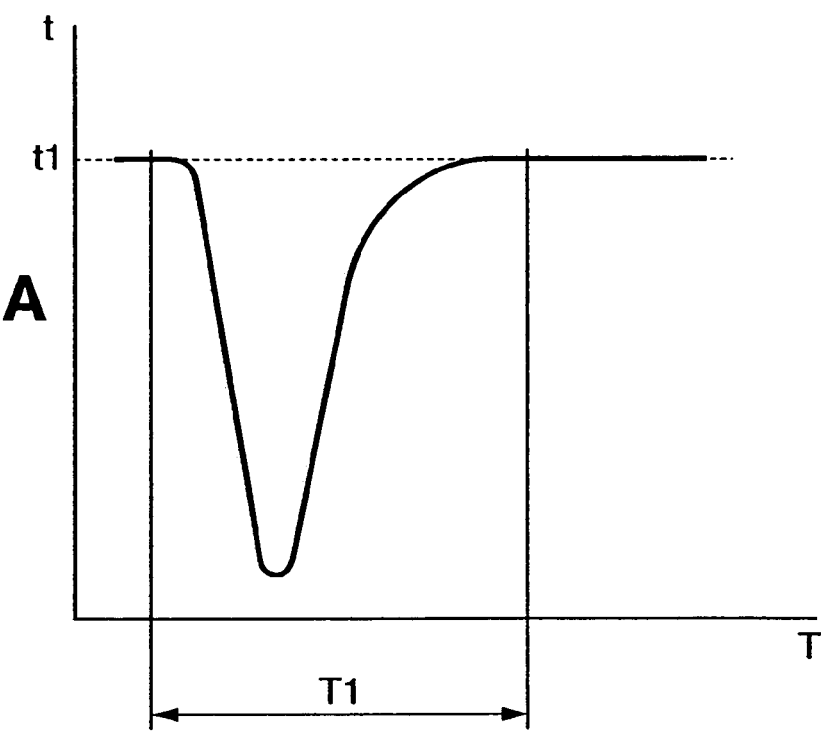
FIGS. 6A and 6B are graphs each showing a change in temperature of a substrate.

In this case, a change in temperature of the substrate (wafer) W represents the curve shown in FIG. 6A. A temperature t of the substrate (wafer) W comes close gradually to a predetermined temperature at which the substrate (wafer) W is to be processed in the process chamber 1 (e.g., t1). That is, the temperature t of the substrate (wafer) W becomes stable in the range of the predetermined temperature after a time TI.

To improve a throughput, if a time for which the substrate (wafer) W is held by the chuck 6 is to be shortened, the temperature of the chuck 6 can be set at a temperature t2 higher than the temperature t1 at which the substrate (wafer) W is to be processed in the process chamber 1 (e.g., 30° C. is set with respect to the processing temperature of 23° C.).

Figure 6B:
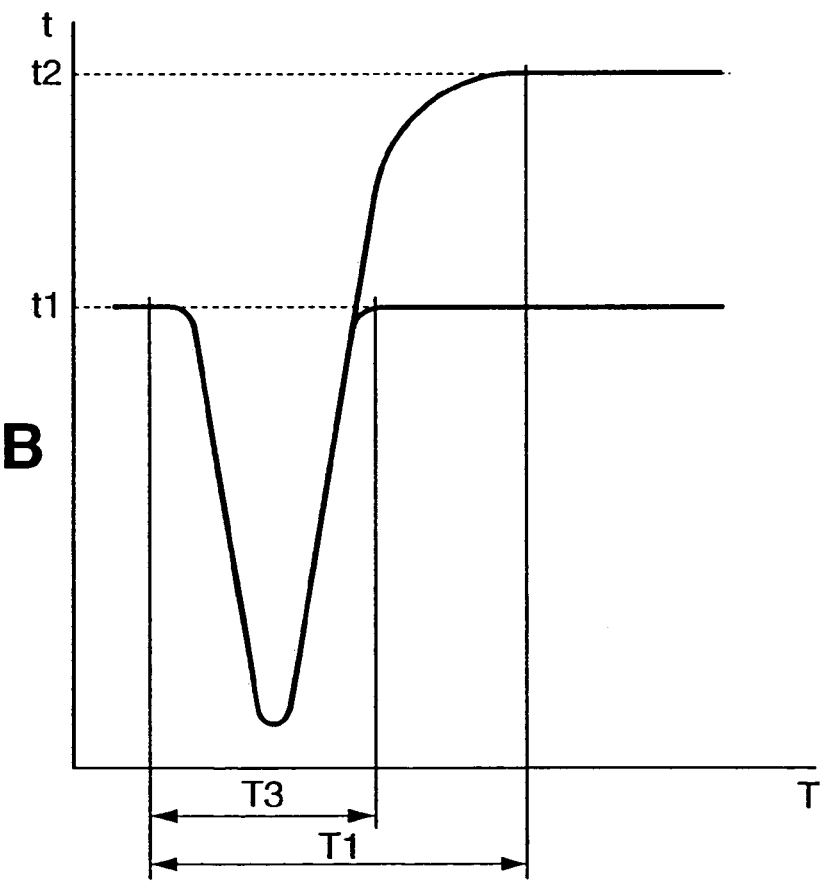
Figure 7:
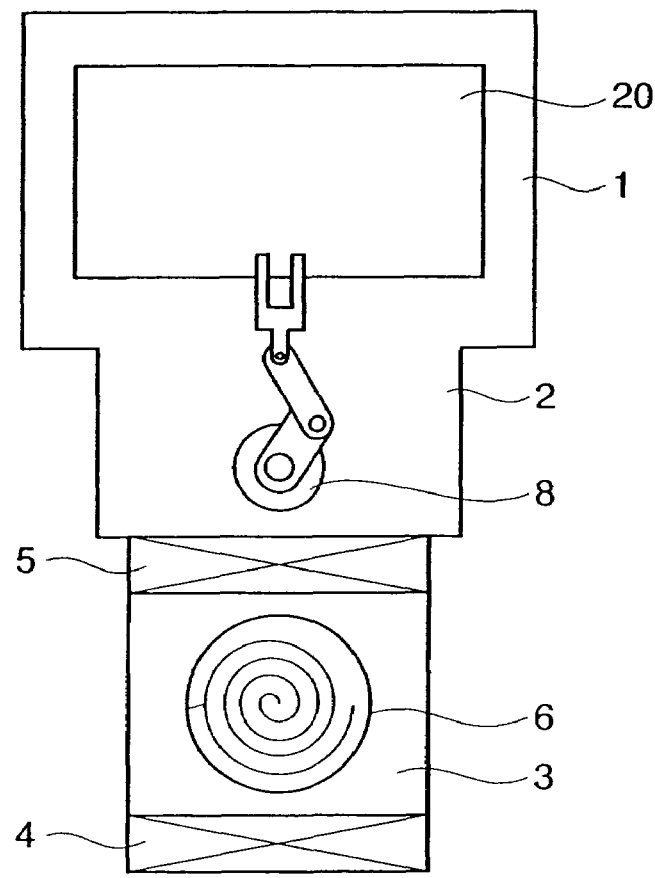
FIG. 7 is a plan view for explaining a conventional apparatus arrangement.
Figure 8:
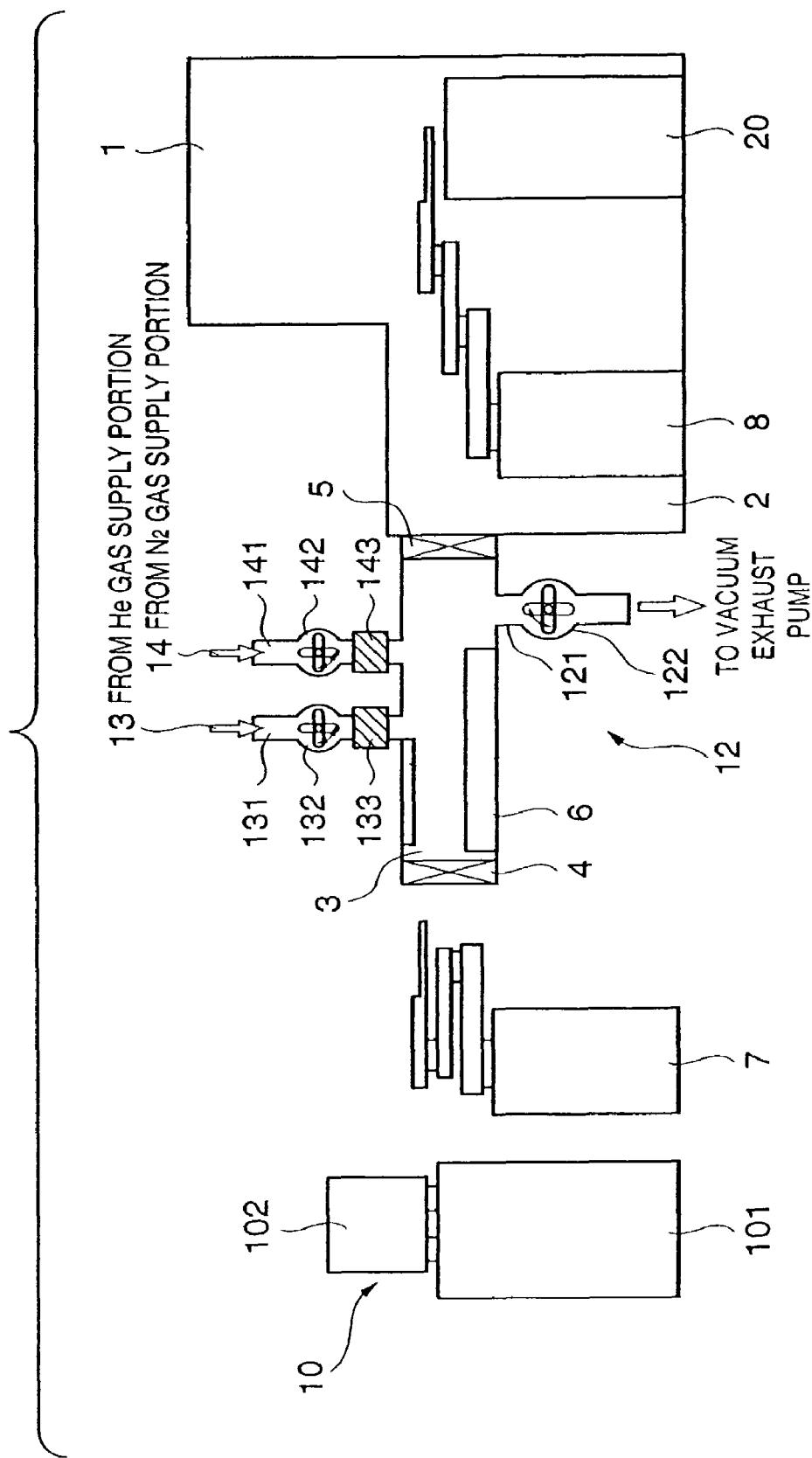
FIG. 8 is an elevational view for explaining the conventional apparatus arrangement.

In this case, a change in temperature of the substrate (wafer) W represents the curve shown in FIG. 6B. The temperature of the substrate (wafer) W gradually increases after the elapse of a time T3, and then closes gradually to the temperature t2 of the chuck 6. When the time T3 has elapsed, the controller 30 controls the chuck 6 to lift the substrate (wafer) W by its three pins 63 and to end thermal regulation operation for the substrate (wafer) W. The controller 30 controls the chuck 6 to stop thermal regulation to the substrate (wafer) W when the time T3 has elapsed, thereby making the temperature at which the substrate (wafer) W at a predetermined temperature at which the substrate (wafer) W is to be processed by the process chamber 1. This has an advantage in that the time T3 for which the substrate holding chuck 6 holds the substrate (wafer) W is shorter than the time T1.

In this case, after a predetermined time (e.g., the t3) has elapsed since the three pins 63 of the chuck 6 move the substrate (wafer) W downward, the controller 30 can control the chuck 6 to lift the substrate (wafer) W by its three pins 63, and control the transfer mechanism to transfer the substrate (wafer) W.

Note that considering heat transfer from the chuck to the substrate (wafer) W and heat conduction of the chuck itself, the chuck 6 is preferably a good heat conductor, such as copper.

Figure 4A:
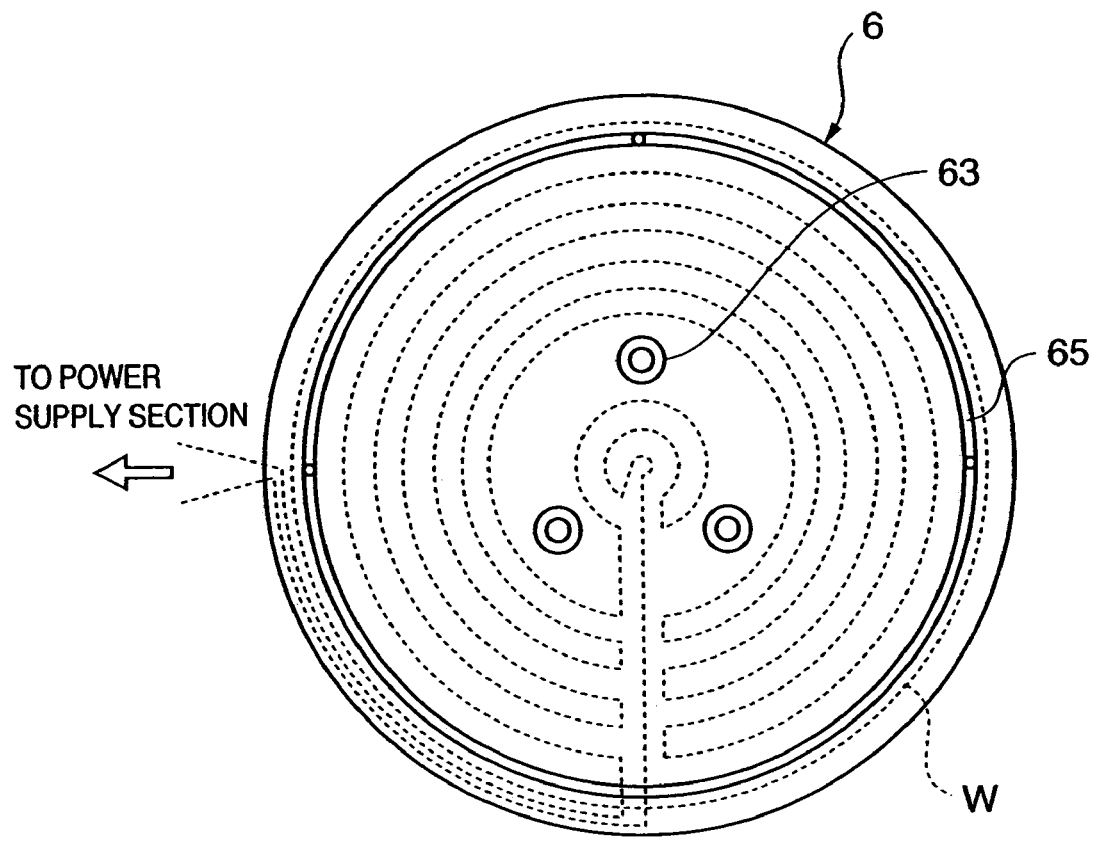
FIGS. 4A and 4B are views for explaining another example of a thermoregulator for a substrate according to the preferred embodiment of the present invention.
Figure 4B:
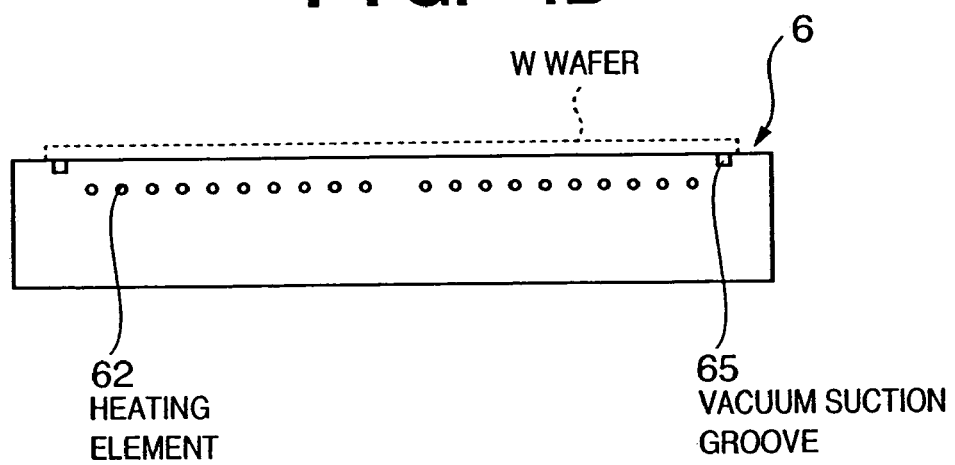

In this embodiment, an electrostatic suction chuck is preferably used as the chuck 6. Unlike the vacuum suction chuck 6 shown in FIGS. 4A and 4B, the electrostatic suction chuck has a characteristic in that its suction force is constant regardless of the pressure of the ambient gas. The vacuum suction chuck 6 shown in FIGS. 4A and 4B has a vacuum suction groove 65 along a concentric circle to vacuum-chuck and hold the substrate (wafer) W.

To prevent particles from attaching to the lower surface of the substrate (wafer) W, the substrate holding chuck 6 in the load-lock chamber 3 preferably has a pin-chuck structure. In the pin-chuck structure, thermal transfer from the chuck 6 to the substrate (wafer) W similarly occurs through contact portions. The ambient gas of the pins is exhausted along with evacuation, and the time T3 depends on a decrease in thermal transfer along with a decrease in pressure of the ambient gas of the pins and the length of time for which the wafer is held by the chuck 6, thereby controlling the time T3 to be constant, as described above.

Figure 5A:
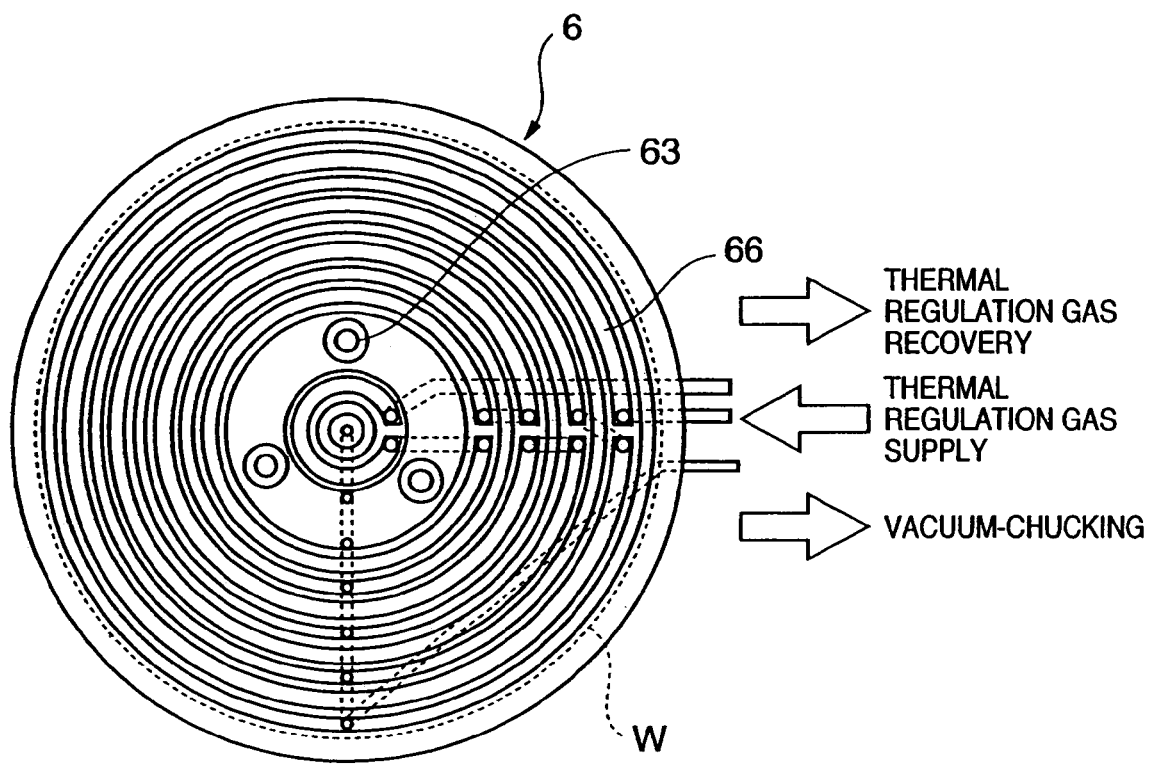
FIGS. 5A and 5B are views for explaining still another example of a thermoregulator for a substrate according to the preferred embodiment of the present invention.
Figure 5B:
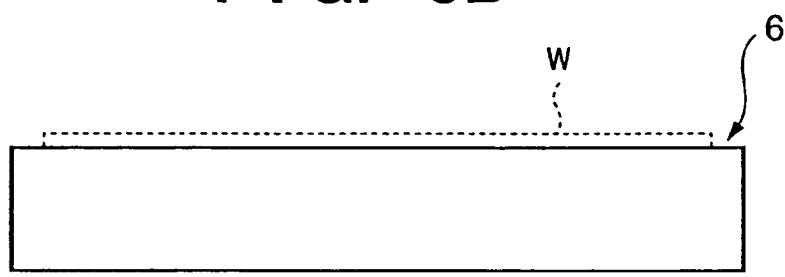

The thermoregulator used as a heating means is not limited to the afore-mentioned heater, and may have a structure so as to cause a fluid to flow, such as a thermal-regulated gas or liquid in holes 66 for circulation formed along a plurality of concentric circles in the chuck 6, as shown in FIGS. 5A and 5B.

The preferred embodiment of the present invention represents an example of controlling all the parameters to become constant, but is not limited to this. A parameter which is to reach a predetermined value without any control, and the like, may not be controlled.

In the present invention, all the parameters are controlled to become constant. However, the present invention is not limited to this, and at least one parameter may be so controlled as to become constant.

For example, the parameter which is to become constant in a predetermined range without any control, a parameter which hardly affects any processing for the substrate (wafer) W and need not be controlled, and the like, may not be controlled.

Another Embodiment of a Substrate Processing Apparatus

In another embodiment to which the present invention is applied, the atmosphere of a process chamber 1, which is the first chamber having a process station (exposure process portion) 20, which performs exposure, and the like, is a vacuum atmosphere.

A load-lock chamber 3 according to the present invention to purge the atmosphere between the process chamber 1 and a substrate supply portion 10 in the air is formed, and a preliminary chamber 2 is formed between the load-lock chamber 3 and process chamber 1.

A second transfer mechanism 8 for transferring a substrate between the load-lock chamber 3 and process station (exposure process portion) 20 is formed in the preliminary chamber 2.

The transfer hand of the second transfer mechanism 8 is so formed as to make an area in contact with a substrate (wafer) W minimum.

For example, the transfer hand of the second transfer mechanism 8 supports the lower surface of the substrate (wafer) W by one or a plurality of pins and opposes the side surfaces of the substrate to grippers or wall members which are spaced at an appropriate gap so as to prevent the substrate from moving in the transfer hand during the transfer. These grippers or walls may have a pin shape, which minimizes an area in contact with the substrate.

The transfer hand of the second transfer mechanism 8 has three or more conical pins, each of which has a sloping portion on its side surface abutting against the side surface of the substrate (wafer) W, and the remaining portion not in contact with the substrate.

In a vacuum atmosphere, since no heat exchange is performed between atmospheric gas and the substrate (wafer) W, the temperature of the substrate unloaded from the load-lock chamber 3 changes depending on contact with the second transfer mechanism 8.

To suppress a change in the temperature of the substrate due to contact of the transfer hand of the second transfer mechanism 8 with the substrate (wafer) W, the contact area of the second transfer mechanism 8 and the substrate (wafer) W is preferably made to be small, as described above.

With this structure, the substrate (wafer) W unloaded from the load-lock chamber 3 is transferred to the process station (exposure process portion) 20 while keeping the temperature of the substrate (wafer) W almost constant.

As described above, in this embodiment, the temperature of the substrate (wafer) W falls within a predetermined temperature range at a timing when the substrate is unloaded from the load-lock chamber 3 by the second transfer mechanism 8.

Thus, the substrate (wafer) W transferred to the process station (exposure process portion) 20 already has a temperature which falls within the range of a predetermined temperature at which the substrate (wafer) W is to be processed in the process chamber. This requires no thermal regulation in the process station (exposure process portion), so that exposure processing can be immediately started, thereby increasing the throughput.

Embodiment of an Exposure Apparatus Main Body

Figure 9:
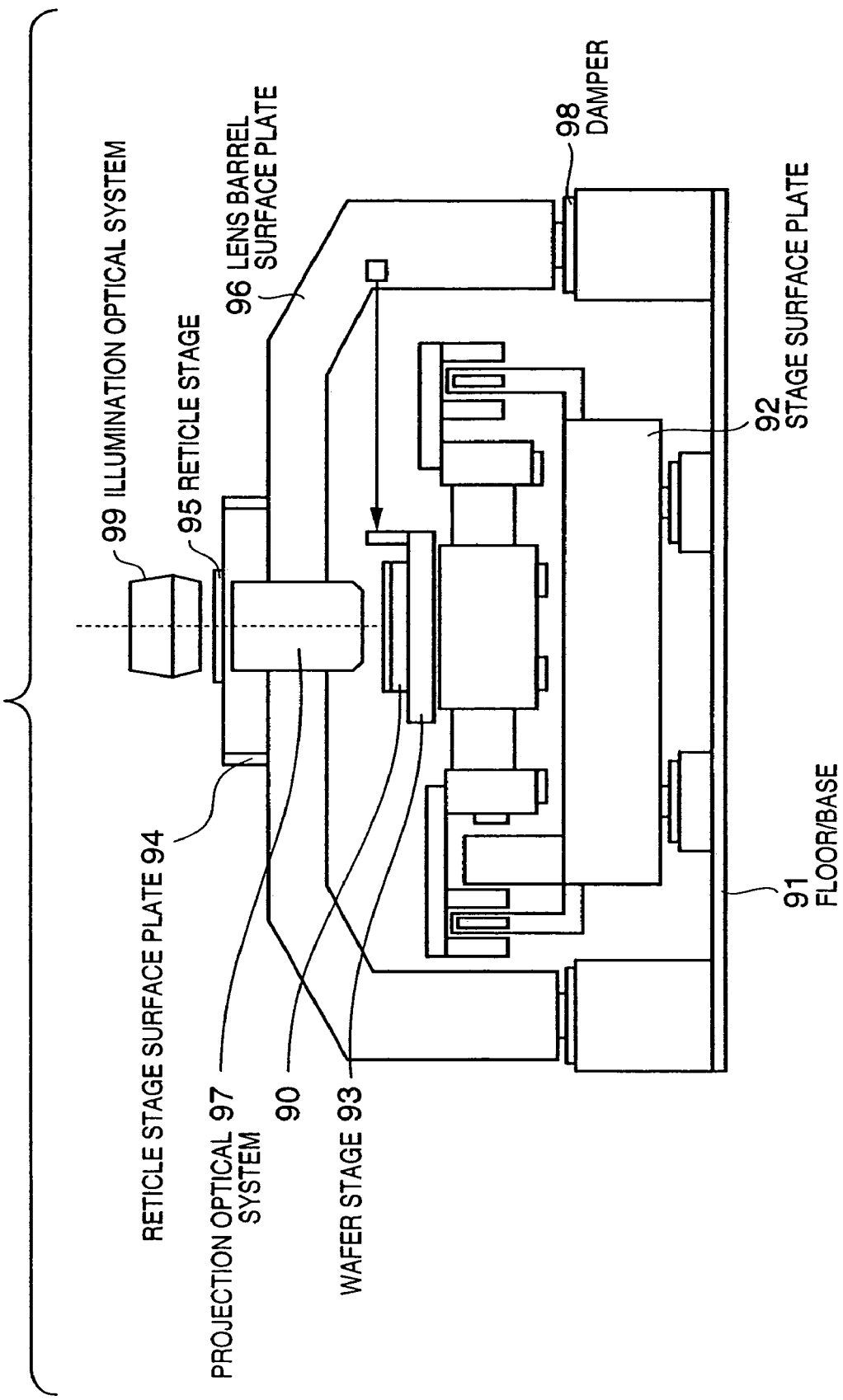
FIG. 9 is a view showing one example of an exposure apparatus main body according to the preferred embodiment of the present invention.

An exposure apparatus main body (exposure process portion) 20 according to an embodiment of the present invention will be described, by exemplifying a scanning exposure apparatus. FIG. 9 is a front view showing an example of the main structure of the scanning exposure apparatus main body according to the preferred embodiment of the present invention. This exposure apparatus main body is arranged in the above process chamber serving as the first process chamber, and performs exposure for a substrate (wafer). In FIG. 9, a lens barrel surface plate 96 is supported by a floor/base 91 via a damper 98. The lens barrel surface plate 96 supports a reticle stage surface plate 94, and also supports a projection optical system 97 arranged between a reticle stage 95 and a wafer stage 93.

The wafer stage 93 having a chuck 90 is supported on a stage surface plate 92 arranged on the floor/base 91, and holds the substrate (wafer) set on the chuck 90 to position the substrate (wafer). The reticle stage 95 is supported on the reticle stage surface plate 94 supported by the lens barrel surface plate 96, and can move while mounting the reticle serving as a master on which a circuit pattern is formed. Exposure light for exposing the reticle mounted on the reticle stage 95 onto the substrate (wafer) on the wafer stage 93 is emitted from an illumination optical system 99.

The wafer stage 93 is scanned in synchronism with the reticle stage 95. During scanning of the reticle stage 95 and the wafer stage 93, the positions of both stages are continuously detected by interferometers, respectively, and the detection results are fed back to driving units of the reticle stage 95 and the wafer stage 93. Hence, the scanning start positions of both the stages can be accurately synchronized, and the scanning speed in a constant-speed scanning region can be controlled with high precision. While both the stages scan the projection optical system 97, the reticle pattern is exposed on the substrate (wafer), and the circuit pattern is transferred.

Embodiment of a Semiconductor Production System

A production system for a semiconductor device (e.g., a semiconductor chip such as an IC or LSI, a liquid crystal panel, a CCD, a thin-film magnetic head, a micromachine, or the like), using an apparatus according to the present invention, will be exemplified. The system performs maintenance services such as trouble-shooting, periodic maintenance, and software distribution for manufacturing apparatuses installed in a semiconductor manufacturing factory by utilizing a computer network, or the like, outside the manufacturing factory.

Figure 10:
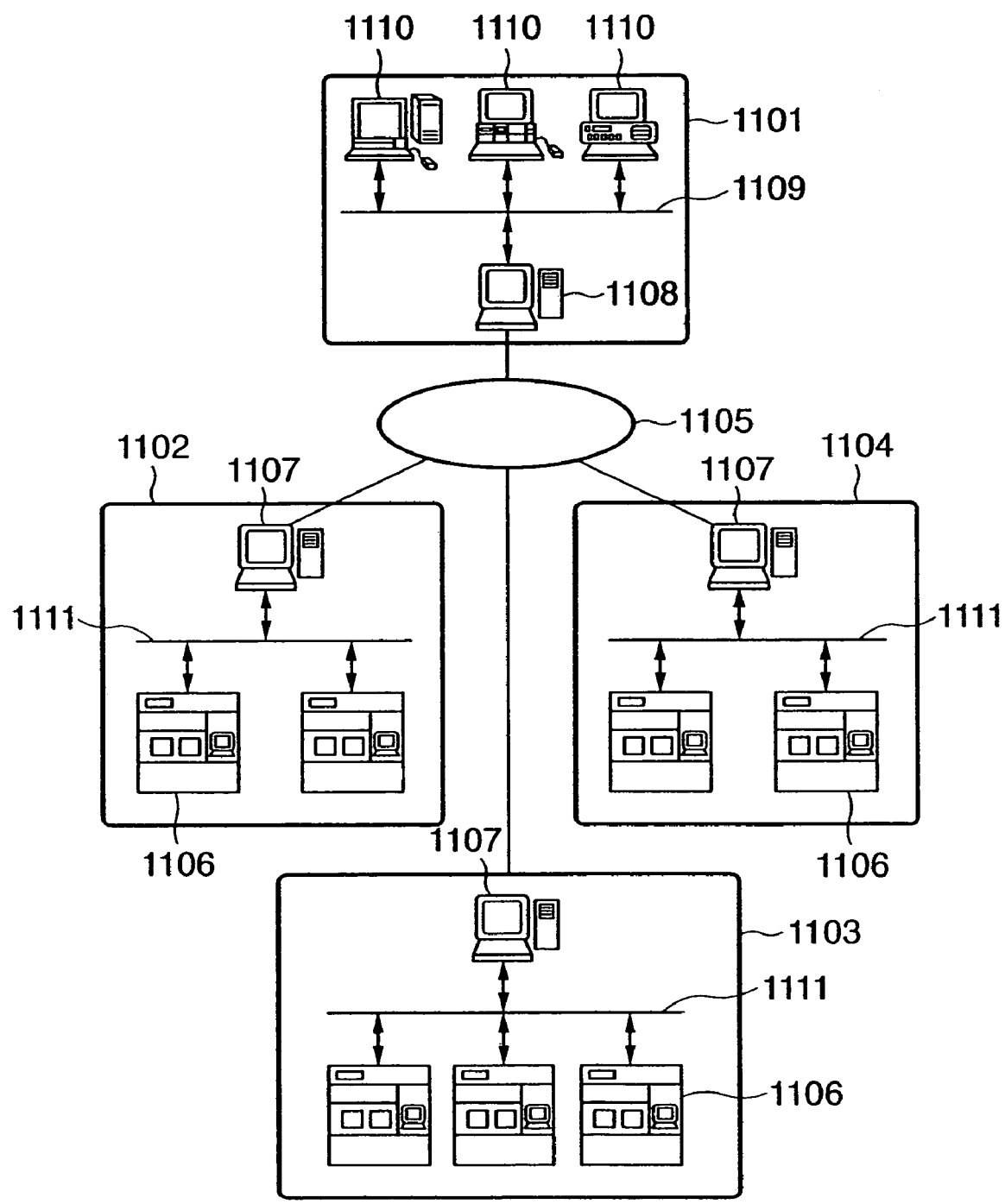
FIG. 10 is a view showing a semiconductor device production system using the apparatus according to the preferred embodiment of the present invention when viewed from a given angle.

FIG. 10 shows the overall system cut out at a given angle. In FIG. 10, reference numeral 1101 denotes an office of a vendor (e.g., an apparatus supply manufacturer), which provides a semiconductor device manufacturing apparatus. Examples of the manufacturing apparatus are semiconductor manufacturing apparatuses for performing various processes used in a semiconductor manufacturing factory, such as pre-process apparatuses (e.g., a lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The office 1101 comprises a host management system 1108 which provides a maintenance database for the manufacturing apparatus, a plurality of operation terminal computers 1110, and a LAN (Local Area Network) 1109, which connects the host management system 1108 and computers 1110 to build an intranet, or the like. The host management system 1108 has a gateway for connecting the LAN 1109 to the Internet 1105 serving as an external network of the office, and a security function for limiting external access.

Reference numerals 1102 to 1104 denote manufacturing factories of the semiconductor manufacturer as users of the manufacturing apparatuses. The manufacturing factories 1102 to 1104 may belong to different manufacturers or the same manufacturer (e.g., a pre-process factory, a post-process factory, and the like). Each of the factories 1102 to 1104 is equipped with a plurality of manufacturing apparatuses 1106, for example, a LAN (Local Area Network) 1111, which connects these apparatuses 1106 to construct an intranet, and a host management system 1107 serving as a monitoring apparatus which monitors the operation status of each manufacturing apparatus 1106. The host management system 1107 in each of the factories 1102 to 1104 has a gateway for connecting the LAN 1111 in the factory to the Internet 1105 serving as an external network of the factory. Each factory can access the host management system 1108 of the office 1101 of a vendor from the LAN 1111 via the Internet 1105. The security function of the host management system 1108 authorizes access of only a limited user. More specifically, the factory can notify the vendor via the Internet 1105 of status information (e.g., the symptom of a manufacturing apparatus in trouble), representing the operation status of each manufacturing apparatus 1106. Also, the factory can receive, from the vendor, response information (e.g., information designating a remedy against the trouble, or remedy software or data) corresponding to the notification, or maintenance information such as the latest software or help information. Data communication between the factories 1102 to 1104 and the office 1101 of the vendor and data communication via the LAN 1111 in each factory adopt a communication protocol (TCP/IP) generally used in the Internet. Instead of using the Internet as an external network of the factory, a high-security dedicated network (e.g., an ISDN), which inhibits access of a third party, can be adopted. The host management system is not limited to the one provided by the vendor. The user may construct a database and set the database on an external network, and the host management system may authorize access to the database from a plurality of user factories.

Figure 11:
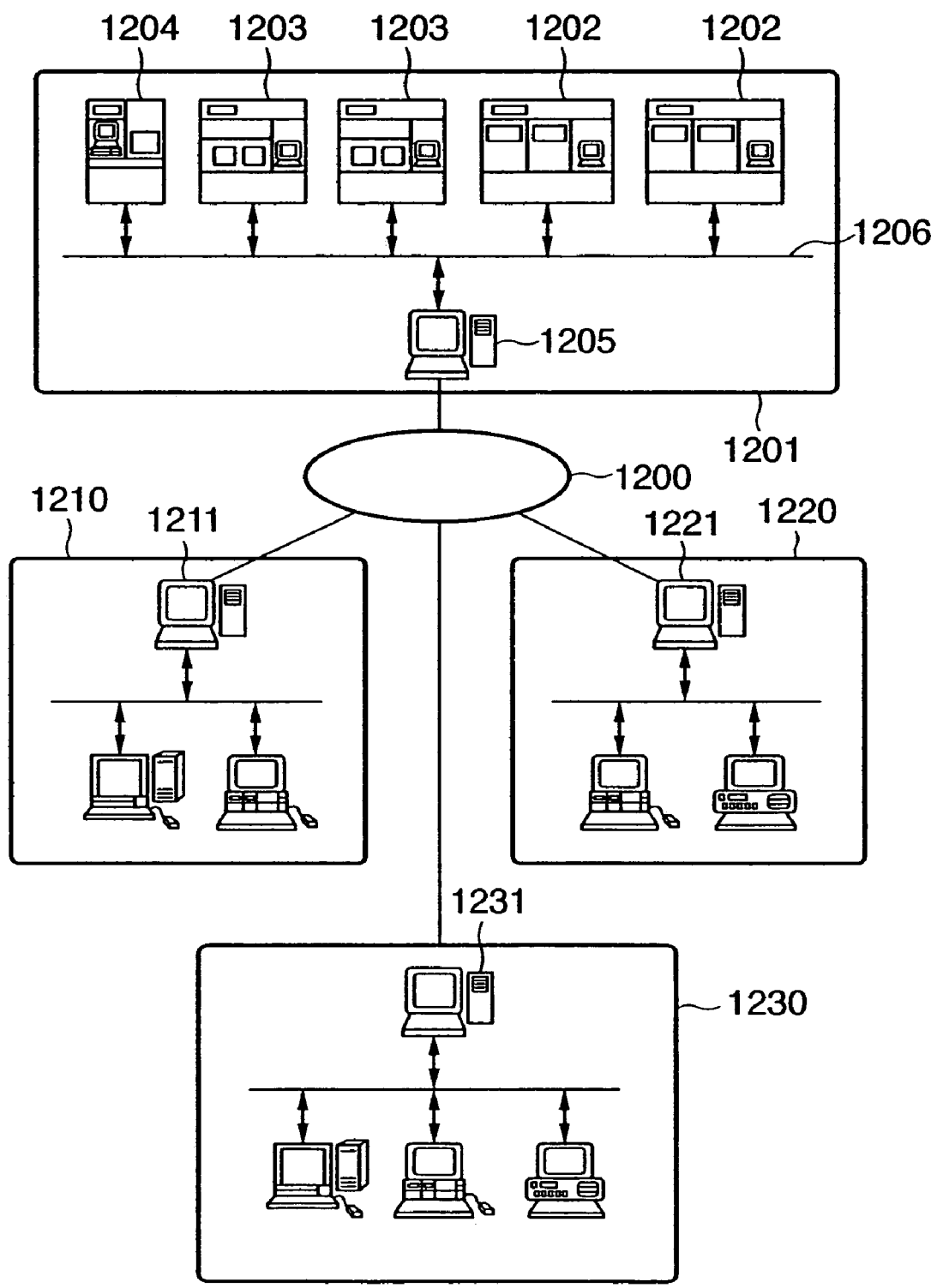
FIG. 11 is a view showing a semiconductor device production system using the apparatus according to the preferred embodiment of the present invention when viewed from another given angle.

FIG. 11 is a view showing the concept of the overall system of this embodiment that is cut out at a different angle from FIG. 10. In the above example, a plurality of user factories having manufacturing apparatuses and the management system of the manufacturing apparatus vendor are connected via an external network, and production management of each factory or information about at least one manufacturing apparatus is communicated via the external network. In the example of FIG. 11, a factory having manufacturing apparatuses provided by a plurality of vendors and the management systems of the vendors for these manufacturing apparatuses are connected via the external network of the factory, and maintenance information of each manufacturing apparatus is communicated. In FIG. 11, reference numeral 1201 denotes a manufacturing factory of a manufacturing apparatus user (e.g., a semiconductor device manufacturer). Manufacturing apparatuses for performing various processes, e.g., an exposure apparatus 1202, a resist processing apparatus 1203, and a film formation apparatus 1204, are installed in the manufacturing line of the factory. FIG. 11 shows only one manufacturing factory 1201, but a plurality of factories are networked in practice. The respective apparatuses in the factory are connected to each other by a LAN 1206 to build an intranet, and a host management system 1205 manages the operation of the manufacturing line.

The offices of vendors (e.g., apparatus supply manufacturers), such as an exposure apparatus manufacturer 1210, a resist processing apparatus manufacturer 1220, and a film formation apparatus manufacturer 1230 comprise host management systems 1211, 1221, and 1231 for executing remote maintenance for the supplied apparatuses. Each host management system has a maintenance database and a gateway for an external network, as described above. The host management system 1205 for managing the apparatuses in the manufacturing factory of the user, and the management systems 1211, 1221, and 1231 of the vendors for the respective apparatuses are connected via the Internet or dedicated network serving as an external network 1200. In this system, if trouble occurs in any one of the manufacturing apparatuses along the manufacturing line, the operation of the manufacturing line stops. This trouble can be quickly solved by remote maintenance from the vendor of the apparatus in trouble via the Internet 1200. This can minimize the stoppage of the manufacturing line.

Each manufacturing apparatus in the semiconductor manufacturing factory comprises a display, a network interface, and a computer, which executes network access software and apparatus operating software, which are stored in a storage device. The storage device is a built-in memory, a hard disk, or a network file server. The network access software includes a dedicated or general-purpose web browser, and provides a user interface with a window, as shown in FIG. 12, on the display. While referring to this window, the operator who manages manufacturing apparatuses in each factory inputs, into input fields on the windows, pieces of information, such as the model of manufacturing apparatus 1401, serial number 1402, subject of trouble 1403, date of occurrence of trouble 1404, degree of urgency 1405, symptom 1406, remedy 1407, and progress 1408. The pieces of input information are transmitted to the maintenance database via the Internet, and appropriate maintenance information is sent back from the maintenance database and provided on the display. The user interface provided by the web browser realizes hyperlink functions 1410 to 1412, as shown in FIG. 12. This allows the operator to access more detailed information of each item, download the latest-version software to be used for a manufacturing apparatus from a software library provided by a vendor, and download an operation guide (help information) as a reference for the operator in the factory. The maintenance information provided from the maintenance database includes information about the present invention described above. The software library also provides the latest-version software for implementing the present invention.

Figure 13:
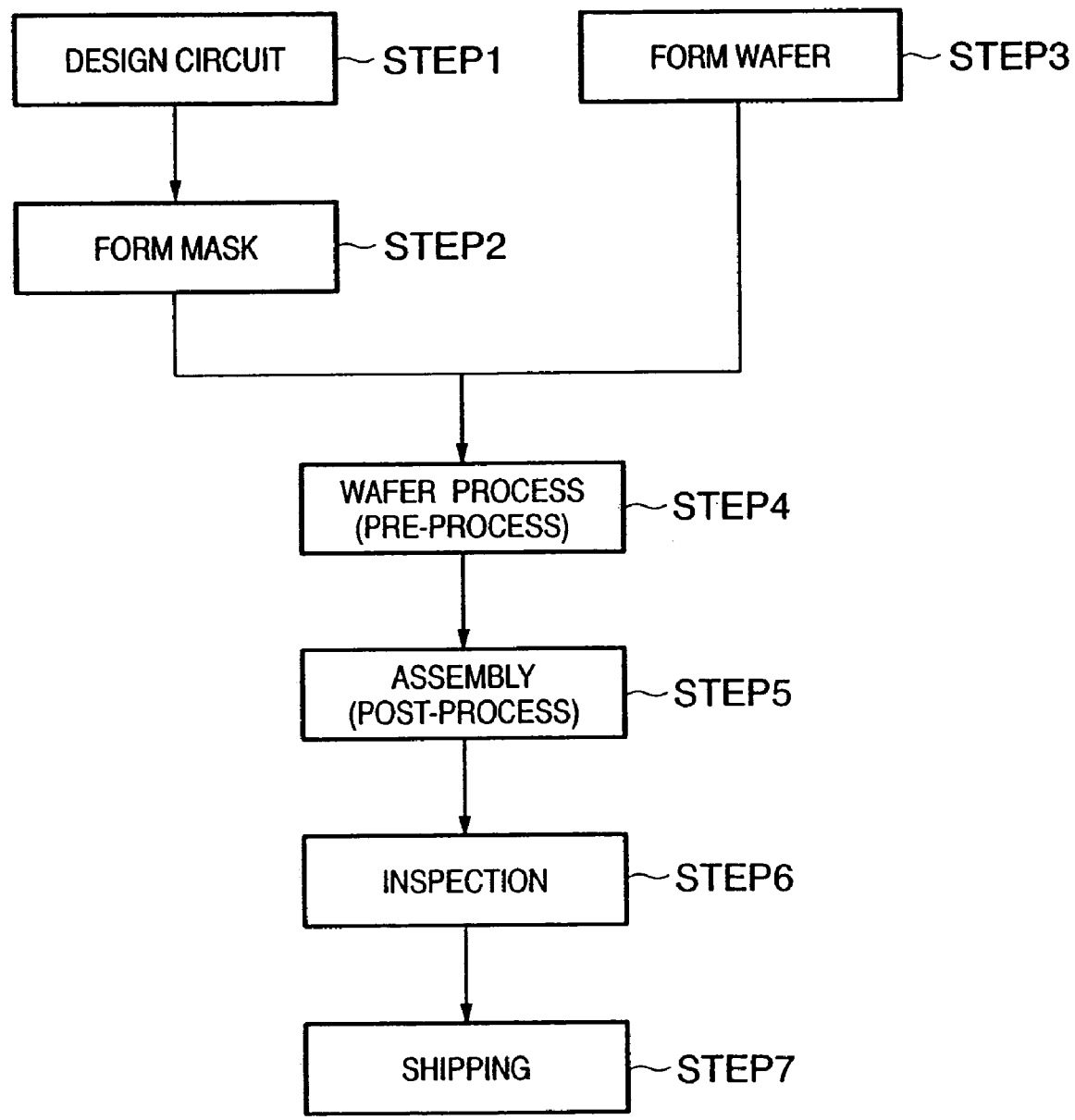
FIG. 13 is a flow chart showing a semiconductor device manufacturing process.

A semiconductor device manufacturing process using the above-described production system will be explained. FIG. 13 shows the flow of the whole manufacturing process of the semiconductor device. In step 1 (circuit design), a semiconductor device circuit is designed. In step 2 (mask formation), a mask having the designed circuit pattern is formed. In step 3 (wafer formation), a substrate (wafer) is formed by using a material such as silicon. In step 4 (wafer process), called a pre-process, an actual circuit is formed on the substrate (wafer) by lithography using the prepared mask and substrate (wafer). Step 5 (assembly), called a post-process, is the step of forming a semiconductor chip by using the substrate (wafer) formed in step 4, and includes an assembly process (dicing and bonding) and a packaging process (chip encapsulation). In step 6 (inspection), the semiconductor device manufactured in step 5 undergoes inspections, such as an operation confirmation test and a durability test. After these steps, the semiconductor device is completed and shipped (step 7). The pre-process and post-process are performed in separate dedicated factories, and each of the factories receives maintenance by the above-described remote maintenance system. Information for production management and apparatus maintenance is communicated between the pre-process factory and the post-process factory via the Internet or dedicated network.

Figure 14:
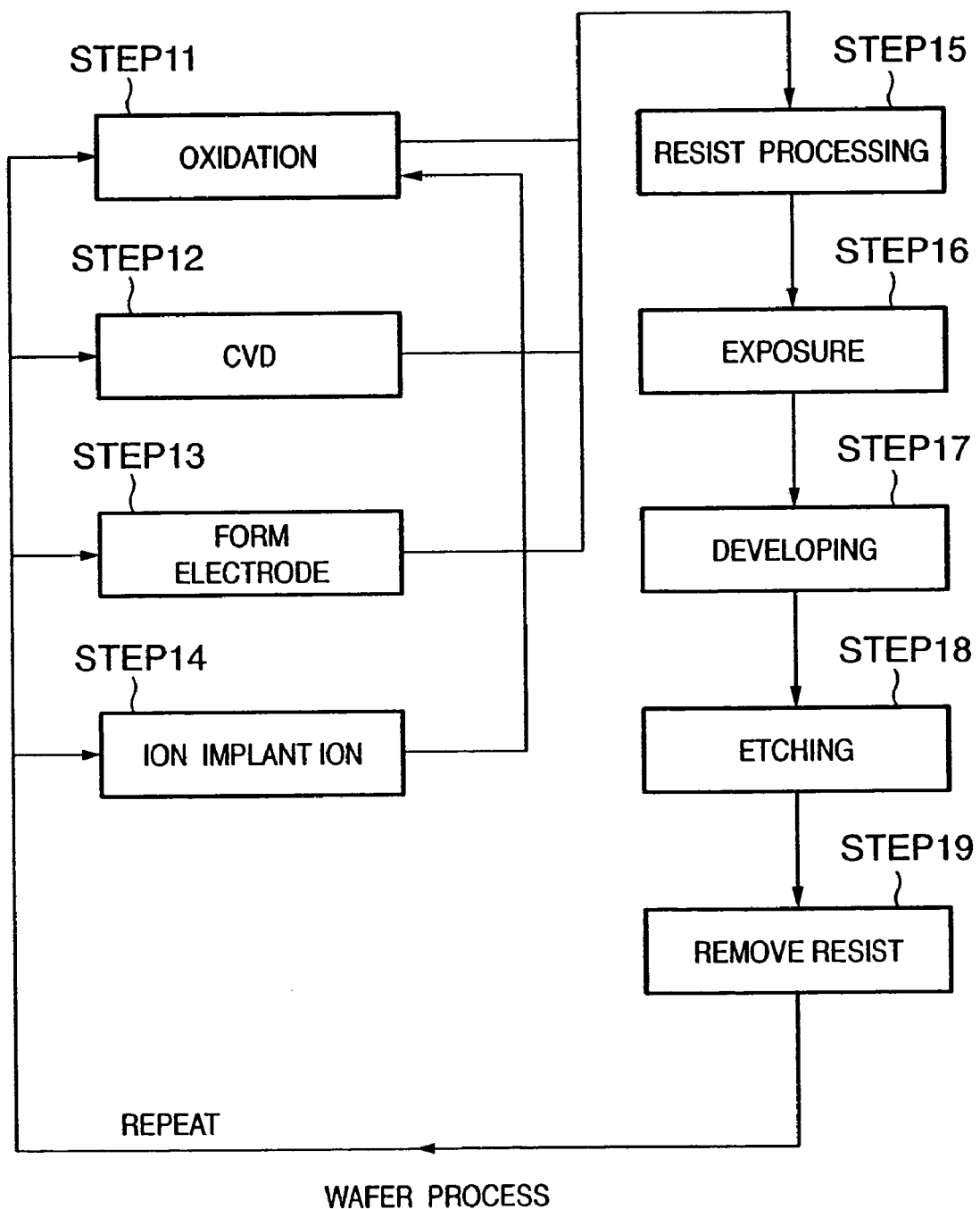
FIG. 14 is a flow chart showing a wafer process.

FIG. 14 shows the detailed flow of the wafer process. In step 11 (oxidation), the substrate (wafer) surface is oxidized. In step 12 (CVD), an insulating film is formed on the substrate (wafer) surface. In step 13 (electrode formation), an electrode is formed on the substrate (wafer) by vapor deposition. In step 14 (ion implantation), ions are implanted in the substrate (wafer). In step 15 (resist processing), a photosensitive agent is applied to the substrate (wafer). In step 16 (exposure), the above-mentioned exposure apparatus exposes the substrate (wafer) to the circuit pattern of a mask, and prints the circuit pattern on the substrate. In step 17 (developing), the exposed substrate (wafer) is developed. In step 18 (etching), the resist is etched except for the developed resist image. In step 19 (resist removal), an unnecessary resist after etching is removed. These steps are repeated to form multiple circuit patterns on the substrate (wafer). A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

According to a preferred embodiment of the present invention, since the temperature of the substrate (wafer) loaded into the apparatus via the load-lock chamber reaches the predetermined temperature at the time of loading, the substrate (wafer) can be immediately processed, e.g., subjected to exposure, thereby improving the throughput.

In particular, the larger effect can be attained in the apparatus with the evacuated chamber.

As many apparently widely different embodiments of the present invention can be made without departing from the spirit and scope thereof, it is to be understood that the invention is not limited to the specific embodiments thereof except as defined in the appended claims.

What is claimed is:

1. A load-lock apparatus to be connected to a process chamber in which a substrate is to be processed, said apparatus comprising:
   a load-lock chamber;
   a first valve to be opened for transferring the substrate to be processed in the process chamber into said load-lock chamber;
   a second valve to be opened for transferring the substrate in said load-lock chamber into the process chamber;
   a chuck, arranged in said load-lock chamber, to hold the substrate;
   a pressure reduction system to reduce a pressure in said load-lock chamber using an exhaust valve; and
   a thermoregulating system to regulate a temperature of said chuck,
   wherein said exhaust valve is controlled such that a previously obtained relationship between a pressure in said load-lock chamber and a time for which said pressure reduction system has operated falls within a predetermined range.

2. An apparatus according to claim 1, wherein said chuck is an electrostatic chuck.

3. An apparatus according to claim 1, wherein said thermoregulating system regulates the temperature of said chuck so that said chuck has a temperature higher than the temperature at which the substrate is to be processed in the process chamber.

4. An apparatus according to claim 3, further comprising a pin to separate the substrate held by said chuck from said chuck in accordance with a time for which the substrate has been held by said chuck.

5. An apparatus according to claim 1, further comprising a gas supply system to supply a gas, the same as that in the process chamber, into said load-lock chamber.

6. An exposure apparatus for exposing a substrate to a pattern, said apparatus comprising:
   a process chamber in which the substrate is to be processed;
   a load-lock apparatus as defined in claim 1; and
   an exposure system, arranged in said process chamber, to expose the substrate to the pattern.

7. An apparatus according to claim 6, wherein said exposure system exposes the substrate in a vacuum atmosphere in said process chamber.

8. An apparatus according to claim 7, wherein the vacuum atmosphere includes a helium gas.

9. A method of manufacturing a device, said method comprising steps of:
   exposing a substrate to a pattern using an exposure apparatus as defined in claim 6;
   developing the exposed substrate; and
   processing the developed substrate to manufacture the device.

10. An apparatus according to claim 1, wherein a force with which said chuck holds the substrate, a relationship between the pressure in said load-lock chamber and the temperature of said chuck regulated by said thermoregulating system are substantially constant so that a temperature of the substrate to be transferred into the process chamber is substantially the same as a temperature at which the substrate is to be processed in the process chamber.

11. A method of processing a substrate, said method comprising steps of:
   transferring the substrate to a chuck arranged in a load-lock chamber via a first valve to be opened for transferring the substrate;
   reducing a pressure in the load-lock chamber using an exhaust valve to a pressure substantially the same as that in a process chamber, connected to the load-lock chamber, for processing the substrate, wherein a gas in the load-lock chamber is cooled due to an adiabatic expansion of the gas;
   regulating a temperature of the chuck;
   transferring the substrate of which a temperature has been regulated on the chuck in the load-lock chamber into the process chamber via a second valve to be opened for transferring the substrate; and
   processing the substrate in the process chamber,
   wherein the exhaust valve is controlled such that a previously obtained relationship between a pressure in the load-lock chamber and a time for which a pressure reduction system has operated falls within a predetermined range.

12. A method according to claim 11, wherein the chuck is an electrostatic chuck.

13. A method according to claim 11, wherein said regulating step regulates the temperature of the chuck so that the chuck has a temperature higher than a temperature at which the substrate is to be processed in the process chamber.

14. A method according to claim 11, further comprising a step of separating the substrate held by the chuck from the chuck using a pin in accordance with a time for which the substrate has been held by the chuck.

15. A method according to claim 11, further comprising a step of supplying a gas, the same as that in the process chamber, into the load-lock chamber.

16. A method according to claim 11, wherein a force with which the chuck holds the substrate, a relationship between the pressure in the load-lock chamber and the temperature of the chuck regulated by the thermoregulating system are substantially constant so that a temperature of the substrate to be transferred into the process chamber is substantially the same as a temperature at which the substrate is to be processed in the process chamber.

* * * * *

UNITED STATES PATENT AND TRADEMARK OFFICE
CERTIFICATE OF CORRECTION

| | | |
|---|---|---|
| PATENT NO. | : 7,024,266 B2 | Page 1 of 1 |
| APPLICATION NO. | : 10/200782 | |
| DATED | : April 4, 2006 | |
| INVENTOR(S) | : Ryo Edo | |

It is certified that error appears in the above-identified patent and that said Letters Patent is hereby corrected as shown below:

IN THE DRAWINGS:
On "Sheet 14 of 14," in "FIG. 14," in the box labeled "STEP 14", "IMPLANTION" should read -- IMPLANTATION--.

COLUMN 7:
Line 8, "with" should read -- which --.

Signed and Sealed this

Second Day of January, 2007

JON W. DUDAS
*Director of the United States Patent and Trademark Office*